(12) United States Patent
Giffard et al.

(10) Patent No.: US 9,245,915 B2
(45) Date of Patent: Jan. 26, 2016

(54) MONOLITHIC MULTISPECTRAL VISIBLE AND INFRARED IMAGER

(75) Inventors: Benoit Giffard, Grenoble (FR); Yvon Cazaux, Grenoble (FR); Norbert Moussy, Sainte Agnes (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 295 days.

(21) Appl. No.: 13/882,441

(22) PCT Filed: Nov. 3, 2011

(86) PCT No.: PCT/FR2011/000587
§ 371 (c)(1),
(2), (4) Date: Apr. 29, 2013

(87) PCT Pub. No.: WO2013/064753
PCT Pub. Date: May 10, 2013

(65) Prior Publication Data
US 2013/0284889 A1    Oct. 31, 2013

(30) Foreign Application Priority Data
Nov. 3, 2010 (FR) .................................. 10 04314

(51) Int. Cl.
*H01L 27/146* (2006.01)
*H01L 31/18* (2006.01)
*H01L 31/0216* (2014.01)

(52) U.S. Cl.
CPC .... *H01L 27/14643* (2013.01); *H01L 27/14621* (2013.01); *H01L 27/14645* (2013.01);

(Continued)

(58) Field of Classification Search
CPC .................. H01L 27/14621; H01L 27/14634; H01L 27/14645; H01L 27/14647; H01L 27/14649; H01L 27/14643; H01L 27/14694; H01L 27/146; H01L 31/18; H01L 31/02165
See application file for complete search history.

(56) References Cited

U.S. PATENT DOCUMENTS 5,373,182 A    12/1994  Norton
5,808,350 A     9/1998  Jack et al.
(Continued)

FOREIGN PATENT DOCUMENTS

FR    2904432 B1    10/2008
JP    A-2-22973     1/1990
(Continued)

OTHER PUBLICATIONS

Jul. 10, 2013 Translation of International Preliminary Report on Patentability issued in International Patent Application No. PCT/FR2011/000587.

(Continued)

*Primary Examiner* — John Lee
(74) *Attorney, Agent, or Firm* — Oliff PLC

(57) ABSTRACT

The invention relates to a radiation detection device including a silicon substrate and an infrared photodiode made of a material optimized for infrared detection. The substrate comprises a photosensitive area, readout circuits, and interconnects formed in an electrically-insulating material. The interconnects and the metal contact connect the readout circuits, the photosensitive areas, and the infrared photodiode. The detection device also comprises an infrared radiation filtering structure which covers the photosensitive area without covering the infrared photodiode.

9 Claims, 4 Drawing Sheets

(52) U.S. Cl.
CPC .......... *H01L27/14649* (2013.01); *H01L 31/18* (2013.01); *H01L 27/14634* (2013.01); *H01L 27/14647* (2013.01); *H01L 27/14694* (2013.01); *H01L 31/02165* (2013.01)

(56) References Cited

U.S. PATENT DOCUMENTS

| | | | |
|---|---|---|---|
| 6,103,544 A * | 8/2000 | Dreiske et al. | 438/48 |
| 6,320,189 B1 * | 11/2001 | Ouvrier-Buffet et al. | 250/338.4 |
| 8,835,924 B2 * | 9/2014 | Gidon et al. | 257/53 |
| 2002/0008191 A1 * | 1/2002 | Faska et al. | 250/208.1 |
| 2006/0124833 A1 | 6/2006 | Toda | |
| 2007/0284532 A1 | 12/2007 | Nakanishi et al. | |
| 2009/0147101 A1 | 6/2009 | Tatani et al. | |
| 2009/0200589 A1 | 8/2009 | Qian et al. | |
| 2009/0302407 A1 | 12/2009 | Gidon et al. | |
| 2010/0163941 A1 * | 7/2010 | Jung | 257/292 |
| 2013/0214160 A1 * | 8/2013 | Cazaux et al. | 250/338.4 |
| 2013/0214161 A1 * | 8/2013 | Cazaux et al. | 250/338.4 |
| 2013/0284889 A1 * | 10/2013 | Giffard et al. | 250/208.1 |

FOREIGN PATENT DOCUMENTS

| | | |
|---|---|---|
| WO | WO 2008/012235 A1 | 1/2008 |
| WO | WO 2008/127297 A2 | 10/2008 |

OTHER PUBLICATIONS

Jul. 25, 2011 French Preliminary Search Report issued in French Patent Application No. 1004314; with English-language translation.
Chen et al., "Wafer-Scale 3D Integration of InGaAs Image Sensors with Si Readout Circuits," IEEE International Conference on 3D System Integration, 2009, pp. 1-4, 3DIC 2009, Institute of Electrical and Electronics Engineers.

* cited by examiner

MONOLITHIC MULTISPECTRAL VISIBLE AND INFRARED IMAGER

BACKGROUND OF THE INVENTION

The invention relates to the field of image sensors, and more specifically of multispectral visible and infrared imagers, operating in night or low lighting level conditions.

STATE OF THE ART

An image sensor enables to generate an electronic signal corresponding point by point to an observed scene. FIG. 1 schematically illustrates in cross-section view a simplified structure in prior art of an active pixel sensor or APS in CMOS technology.

Each pixel comprises an optical portion 10 assembled on a substrate 11. Substrate 11 comprises a readout circuit 12 and a photodiode 13 formed in a silicon layer 14. Readout circuits 12 are connected to photodiodes 13 and are interconnected by means of interconnects 15 which are formed above layer 14 in a layer of an electrically-insulating material 16, such as silica.

Optical portion 10 comprises microlenses 17, which focus the incident radiation of the respective photodiodes 13, and an array of colored resin filters 18 in correspondence with the array formed by photodiodes 13. The filter array comprises filters 18-R, 18-V, and 18-B respectively corresponding to the elementary colors, red, green, and blue.

Currently, APS sensors, even low-cost, provide a high-quality color image. There however remain imperfections. Indeed, colored resins used in APS sensors are not dense. Accordingly, a relatively large thickness, on the order of one micrometer, is necessary for a high-performance filtering of elementary colors.

Now, the size of recent image sensor pixels also is on the order of one micrometer. This pixel dimension raises an issue due to the shading effect which appears when the radiation reaches the sensor surface with a wide incident angle. In such conditions, the photons cross a filter and end their trajectory in the photodiode associated with the neighboring filter.

The problem due to the thickness of colored resins considerably slows down the miniaturization of image sensors. The use of colored resins also suffers from their inability to filter infrared. It is thus necessary to add, over the entire image sensor, an additional filter to remove the infrared component of the radiation.

APS sensors have another problem due to an alteration of the image quality in night or low lighting level conditions. To overcome this problem, near infrared detection is frequently used.

The spectral response of photodiodes mainly depends on the selection of the photosensitive semiconductor material in which they are formed. Photons are only absorbed by the photosensitive semiconductor material if their energy is higher than the bandgap. The latter corresponds to the energy that an electron has to absorb, in the form of a photon, to be able to leave the valence band for the conduction band. The electron thus becomes mobile: it has been photogenerated.

The semiconductor material most currently used to form image sensors is silicon. However, to detect wavelengths beyond the visible range, the use of a very thick silicon layer is necessary. Silicon however remains transparent for wavelengths beyond one micrometer, and cannot be used as an infrared radiation detection material.

For a detection beyond a one-micrometer wavelength, semiconductor materials having a smaller bandgap than silicon, such as germanium or indium gallium arsenide (InGaAs) are selected. An InGaAs layer having a 0.5-µm thickness appears to be sufficient to absorb 90% of the 0.9-µm wavelength flow. To absorb the same flow and convert it into electric current, it is necessary to use a silicon layer having a 100-µm thickness. An InGaAs layer can detect wavelengths up to 1.6 µm.

For infrared imaging sensors, III-V semiconductor materials are generally used since they have very advantageous photodetection capacities in this wavelength range. This type of sensors comprises a portion made of silicon or of an equivalent material used as a basis for CMOS technology, where readout circuits are formed.

An example of infrared imaging sensor is formed by cutting up a photodiode and a readout circuit array and by assembling them according to the flip-chip technique. However, this type of method is not adapted to a large-scale integration. Indeed, the method for solving alignment problems and problems associated with thermomechanical constraints must be the object of special care.

To attenuate the impact of these problems, methods using a molecular bonding assembly may be implemented. This assembly is for example described in article "Wafer-scale 3D integration of InGaAs image sensors with readout circuits", by C. L. Chen et al.—IEEE International Conference on 3D System Integration, 2009, pp. 1-4. This type of method however remains complex and suffers from a decrease of the infrared image sensor efficiency.

No usual semiconductor material currently enables to form photodiodes which efficiently detect both a radiation in the visible range and an infrared radiation. In applications where it is desired to process both visible and infrared, hybrid sensors have to be formed, as described, for example, in U.S. Pat. No. 5,808,350. The near infrared detection, in this type of sensors, is ensured by an InGaAs/Si heterojunction. Such a heterojunction is formed by molecular bonding of an InGaAs layer on a back surface of silicon substrate. The silicon substrate also comprises a visible detector and readout circuits formed at its front surface. The forming of such a sensor is complex. In particular, the forming of an InGaAs/Si heterojunction to detect near infrared radiation is difficult to control.

Further, a hybrid sensor comprising an infrared detector containing a microbolometer has also been used for the detection of visible and infrared radiations. This type of sensors is for example described in US patent application 2007/284532. The hybrid detection in this sensor is performed by a visible radiation detector forming a visible pixel and four infrared radiation detectors forming an infrared pixel. The two types of detectors are formed from a silicon substrate comprising local silicon oxide areas. Infrared detectors are of microbolometer type comprising a structure made of a material absorbing infrared radiations. The absorption of an infrared radiation generates a temperature increase converted by a thermoelectric module into an electric signal directly conveyed to a processing module.

SUMMARY OF THE INVENTION

Certain applications will require a hybrid image sensor which further enables to obtain a color image while being easy to form and compact.

This need tends to be satisfied by providing a radiation detection device comprising a silicon layer provided with a front surface and with a back surface, a photodiode formed on the front surface of the silicon layer, first and second readout circuits formed on the front surface, the first readout circuit being connected to the photodiode. The device also comprises an infrared photodetector laterally offset with respect to the photodiode, and an electrically-insulating layer covering the front surface of the silicon layer to cover the first and second readout circuits and the photodiode. The infrared photodetector of said device is an infrared photodiode made of a material optimized for infrared detection. The infrared photodiode is arranged on the electrically-insulating layer and is connected to the second readout circuit via an interconnect crossing the electrically-insulating layer and emerging at the surface of the electrically-insulating layer. The device is provided with an infrared radiation filtering structure covering the photodiode and leaving the infrared photodiode exposed.

The invention also provides a method for forming a radiation detection device comprising the steps of: providing a silicon layer provided with a front surface and with a back surface and comprising an electrically-insulating layer covering the front surface of the silicon layer and of first and second readout circuits and a photodiode formed on the front surface of the silicon layer; providing a stack of infrared photodiode layers, based on a material optimized for infrared detection; assembling the stack of layers on the electrically-insulating layer; etching the stack of layers above the photodiode while leaving an island of the stack, forming an infrared photodiode; forming an infrared radiation interference filter structure on the photodiode and on the infrared photodiode; and removing the filtering structure above the infrared photodiode.

BRIEF DESCRIPTION OF THE DRAWINGS

Other advantages and features will become more clearly apparent from the following description of particular embodiments of the invention given for non-restrictive example purposes only and illustrated by means of the appended drawings, in which.

DESCRIPTION OF A PARTICULAR EMBODIMENT

To enable a same sensor to form a high-quality conventional color image and an image with a high sensitivity in near infrared, it is preferable to use the semiconductor materials most adapted to the different targeted spectrums.

It is thus advantageous to take advantage both of image sensors using the CMOS technology and of infrared sensor based on an appropriate semiconductor material, while avoiding their disadvantages.

To form an association of a conventional color image sensor and of a high-sensitivity infrared photodiode, a hybrid integration compatible with the CMOS structure is envisaged.

Figure 1:
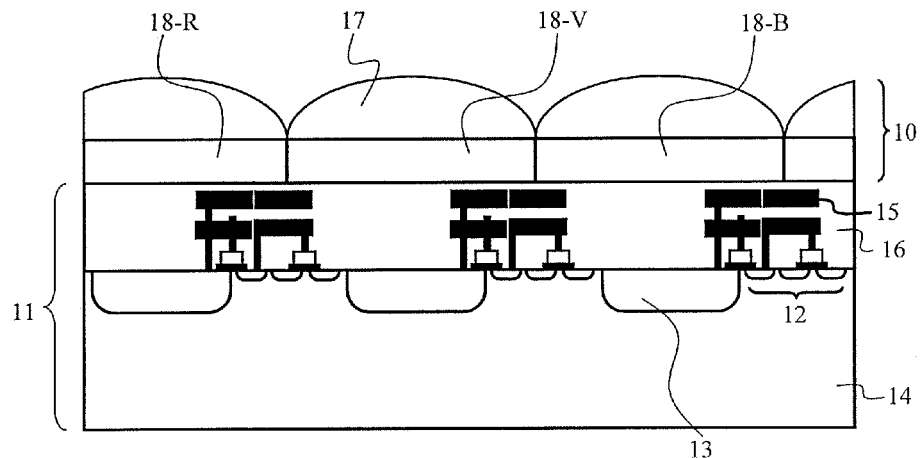
FIG. 1 schematically shows in cross-section view an APS image sensor according to prior art.
Figure 2:
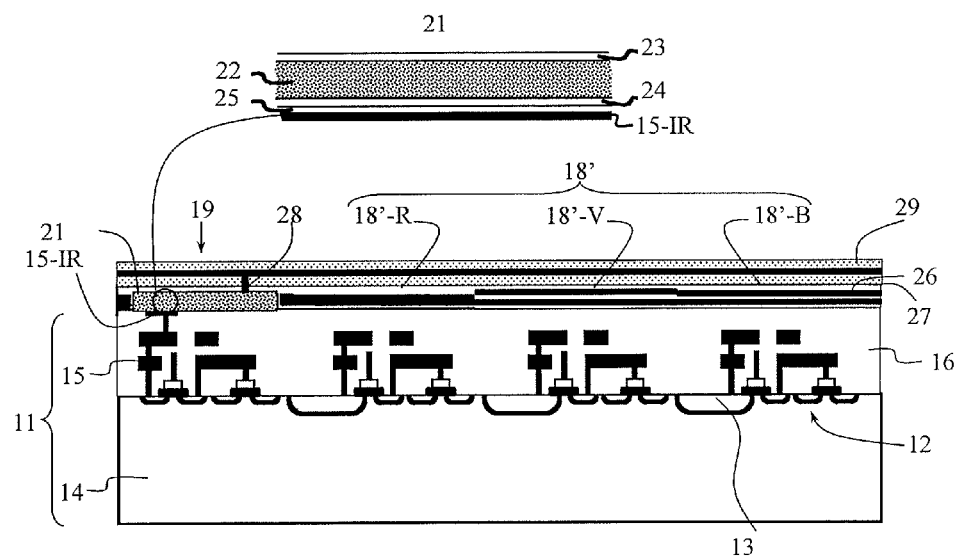
FIG. 2 schematically shows, in cross-section view, an embodiment of a radiation detector according to the invention.

FIG. 2 schematically illustrates an embodiment of a radiation detector which tends to satisfy these constraints. It is based on a conventional sensor of the type in FIG. 1. Thus, the device comprises elements similar to those illustrated in FIG. 1, designated with the same reference numerals. It especially shows a CMOS structure formed in a substrate 11 comprising a silicon layer 14 provided with a front surface and with a back surface. It also shows a photodiode 13 and first 12-1 and second 12-2 readout circuits 12 formed on the front surface, first readout circuit 12-1 being connected to photodiode 13.

The radiation detector comprises an electrically-insulating layer 16 covering the front surface of silicon layer 14 to cover first and second readout circuits 12-1 and 12-2 and photodiode 13. The radiation detector comprises pixels associated with the three elementary colors, each comprising a photodiode 13. The optical portion comprising the microlenses and resin filters 18 of FIG. 1 is replaced with an interference filter structure 18', described in further detail hereafter.

Three elementary colors means three spectral decompositions paths necessary for color reproduction.

For each group of three color pixels, the CMOS structure of FIG. 2 comprises a fourth pixel 19, incomplete in the CMOS structure. This pixel is incomplete in that its photodiode 13 is inoperative. The pixel may even not comprise photodiode 13. This pixel forms an infrared pixel with the elements described hereafter.

An infrared photodetector 21 in the form of an island is arranged on dielectric interconnection layer 16, locally at the level of infrared pixel 19. This island, forming an infrared photodiode 21, is formed by using a mesa method. Infrared photodiode 21 is arranged to be laterally offset with respect to photodiode 13. It here is a PIN-type (Positive Intrinsic Negative) infrared photodiode which comprises a layer of an intrinsic photosensitive semiconductor material 22 adapted to infrared, interposed between a p-doped semiconductor material layer 23 and an n-doped semiconductor material layer 24. Layer 24 is covered with metallization layer 25 to provide cathode contact. Anode contact is performed by a narrow metal line 28 formed in a layer 29 made of a dielectric material transparent to the incident radiation. Layer 29 is arranged above photodiode 21 and interference filters 18'.

The semiconductor materials of layers 23 and 24 may be identical or of different natures. Preferably, layers 23 and 24 are made of indium phosphide (InP). Preferably, photosensitive material 22 is a semiconductor material having a bandgap smaller than 0.8 eV. In other words, infrared photodiode 21 is made of a material optimized for infrared detection. Here, material 22 is made of a gallium indium arsenide alloy (InGaAs) deposited by epitaxy on p-type doped InP layer 23. Layer 25 and line 28 are for example made of Cu or of Ti/Au. Line 28 may also be replaced with a transparent metal layer such as indium tin oxide (ITO) or zinc oxide (ZnO). This transparent conductive layer may be locally removed above the infrared pixel to improve the transparency towards this infrared pixel.

In pixel 19, one of interconnects 15 (corresponding to that which is used in every other pixel to contact its photodiode 13) is in contact with metal layer 25 of photodiode 21. This contact is made via a contact metallization 15-IR at the surface of electrically-insulating layer 16. Infrared photodiode 21 is thus connected to its readout circuit 12 in CMOS technology. In other words, infrared photodiode 21 is arranged on electrically-insulating layer 16 and connected to second readout circuit 12-2 via interconnect 15-IR crossing electrically-insulating layer 16 and emerging at its surface. Infrared photodiodes 21 are also collectively connected to the anode contacting area by means of conductive line 28. This conductive line is itself connected to a positive potential which biases all the infrared photodiodes. To overcome the problems due to resin filters, the radiation detection device according to the invention comprises an interference filter structure 18' adjacent to infrared photodiode 21, that is, covering visible spectrum CMOS photodiodes 13 without covering infrared photodiode 21.

The interference filters are for example similar to those described in patent FR2904432. They are formed of a stack comprising an alternation of at least two metal layers 26 and of at least two dielectric layers 27. The metal layers may be made of silver (Ag) and the dielectric layers may be made of silicon nitride ($Si_3N_4$).

In addition to filtering the infrared component of the incident radiation, which feature is desired for the detection in the visible spectrum, interference filters 18' can also decompose a light ray into elementary colors. Thereby, the device shown in FIG. 2 may comprise three interference filters 18'-R, 18'-V, and 18'-B corresponding to three elementary colors. Filters 18' are arranged, in this case, above three associated photodiodes 13. Each of the three interference filters 18'-R, 18'-V, and 18'-B enables to filter at the same time the infrared component and two components associated with two of the three elementary colors of the incident radiation. In other words, infrared radiation filtering structure 18' has a spectral transmission characteristic corresponding to at least one of the three decomposition paths necessary to reproduce the colors.

The thickness of infrared interference filters 18' is smaller than that of resin filters. Thereby, interference filters 18' advantageously contribute to the miniaturization of image sensors according to the invention.

As can be seen in FIG. 2, infrared photodiode 21 and filters 18' have a surface exposed to the incident radiation in a same plane. This layout of the interference filter and of the infrared photodiode eases the attenuation of the shading effect caused by the oblique angles of incidence of the radiation far from the sensor center. Indeed, infrared photodiode 21 may be repositioned, as it is conventionally done for filters with respect to photodiodes 13 to compensate for the oblique incidence of the radiation.

FIGS. 3 to 8 illustrate successive steps of a method for forming a radiation detector according to the invention.

Figure 3:
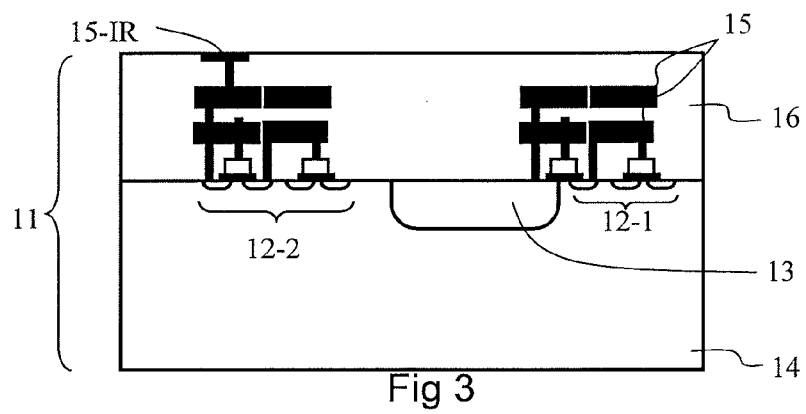
FIGS. 3 to 8 illustrate successive steps of a method for forming a radiation detector according to the invention.

FIG. 3 shows an original structure 30 totally made in CMOS technology, corresponding to the elements formed in substrate 11 comprising silicon layer 14, which is provided with a front surface and with a back surface. Layer 16 covers the front surface and first and second readout circuits 12-1 and 12-2 and photodiode 13. Readout circuit 12-1 is associated with visible spectrum photodiode 13, and readout circuit 12-2 is associated with the future infrared photodiode.

CMOS structure 30 also comprises metal contact 15-IR arranged at the surface of silicon substrate 11, used to connect the future infrared photodiode to its readout circuit 12-2.

Figure 4:
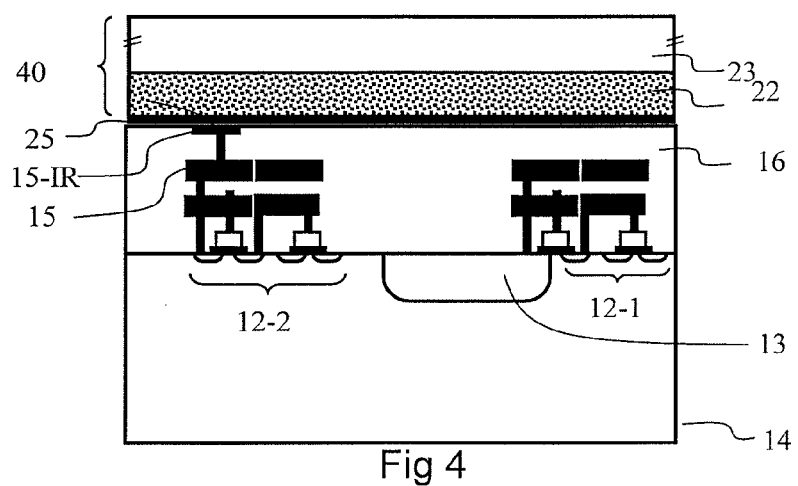

In FIG. 4, a stack of infrared photodiode layers 40 is made with a material optimized for infrared detection and it is assembled on CMOS structure 30. As shown in FIG. 2, this stack preferably comprises an intrinsic InGaAs layer 22 deposited by epitaxy on a p-type InP substrate 23.

InP substrates are known to be mechanically fragile. Because of this, they are generally only available in wafers of 2 or 3 inches. Such wafer dimensions are different from those of silicon wafers comprising conventional image sensors. In such conditions, it is desirable to cut out the wafers comprising the infrared photodiode stack before the assembly step. The wafers are cut out into chips corresponding to the dimensions of the sensors to be formed. Thus, the entire sensor is, in FIG. 4, covered with stack 40. Further, to simplify the forming of stack 40, metallization 25, used as a cathode contact for the future infrared photodiodes, is deposited "full wafer" and thus extends over the entire lower surface of stack 40, and does not define individualized infrared photodiodes yet.

Stack 40 is assembled on electrically-insulating layer 16 in such a way that metallization layer 25 is in contact with the front surface of CMOS structure 30 and at the same time with metal contact 15-IR. This assembly is preferably performed by means of a conventional metal-metal bonding.

The assembly may be performed by any means enabling to rigidly attach the infrared photodiode stack to structure 30 while providing an electric connection between metal contact 15-IR and metallization layer 25.

Figure 5:
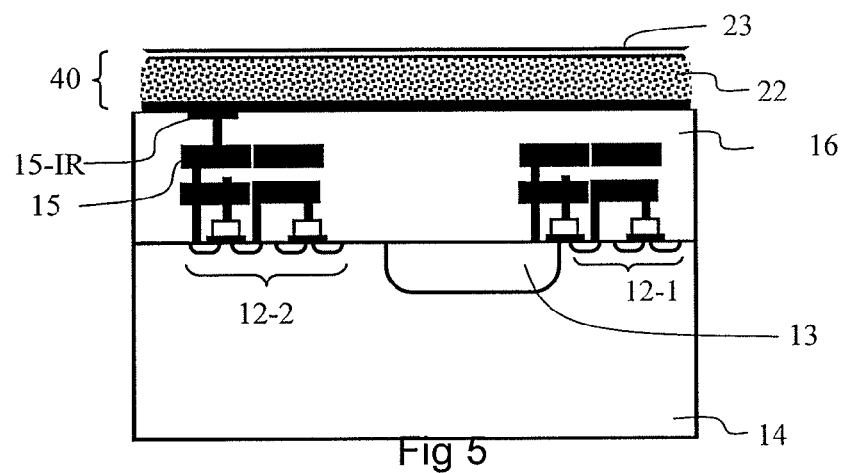

In FIG. 5, a large portion of the InP substrate is removed, for example by CMP (chemical-mechanical planarization). To limit the thickness and the associated shading effects, only a thin p-doped InP layer 23 remains above InGaAs layer 22.

Figure 6:
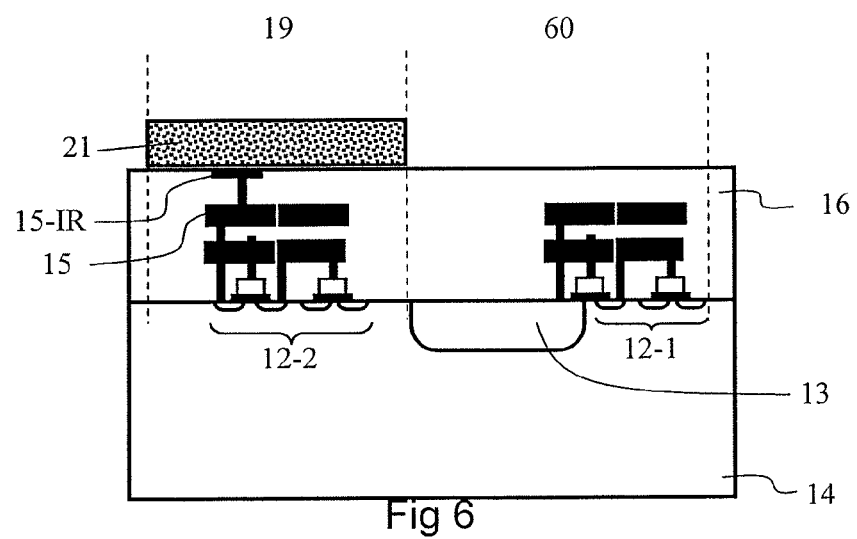

As illustrated in FIG. 6, a visible pixel 60 and an infrared pixel 19 are formed at the surface of electrically-insulating layer 16. Pixels 60 and 19 are formed by etching of stack 40. The etching enables to delimit an island forming infrared photodiode 21. Stack 40 is removed above visible photodiode 13 by this same etching. Visible pixel 60 can then be exposed to an incident radiation on the front surface.

The fact of assembling stack 40 before the forming of infrared photodiode 21 simplifies the manufacturing process. Alignment problems which may arise on assembly of a completed infrared photodiode with the CMOS structure are also overcome.

Figure 7:
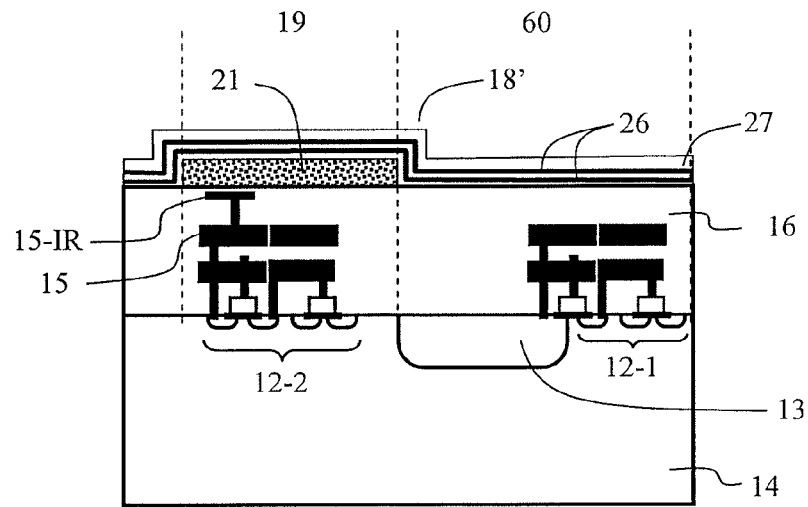

In FIG. 7, an infrared interference filter 18' is formed above pixels 19 and 60.

To ease the manufacturing method, interference filter 18' is formed all over the front surface of the structure of FIG. 6. In other words, infrared radiation interference filter structure 18' is formed on photodiode 13 and on infrared photodiode 21. Indeed, it is easier to selectively remove a material than to selectively deposit the same material. Thus, infrared photodiode 21 is covered with filter 18', which makes it useless at this stage.

Figure 8:
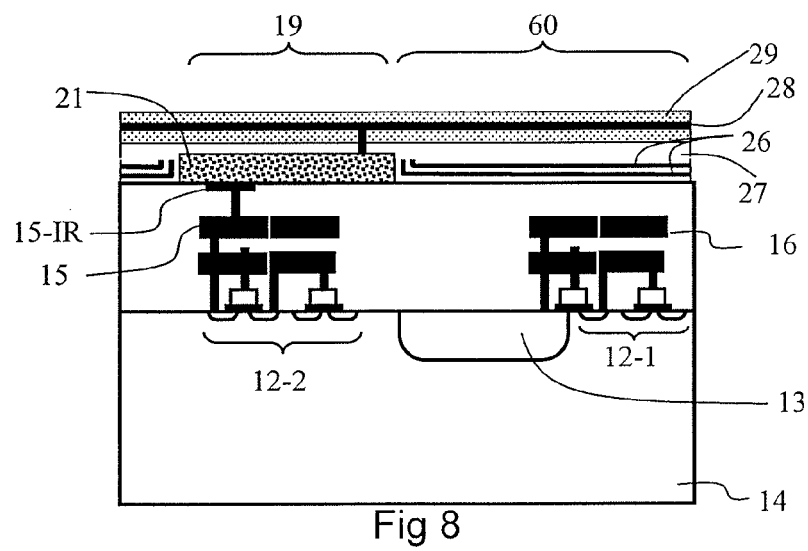

In FIG. 8, filter 18' is selectively removed above infrared photodiode 21. The removal of filter 18' may be performed by etching or any other known technique. Preferably, the removal is performed by chemical-mechanical planarization (CMP).

To form metallic anode contact 28, a dielectric layer 29 is deposited. By means of a photolithography step followed by an etching of layer 29, the location of line 28 and of a space providing access to infrared photodiode 21 is defined. Finally, a step of filling with a metal is performed to form metal line 28. Line 28 may be formed by the damascene method or by any other known means. An upper metal contact, not shown in FIG. 8, is connected to line 28. It is then transferred to the edge of the infrared pixel to be connected to one of interconnection pads 15. After a chemical-mechanical planarization (CMP) of layer 29 and the deposition of a planarization material transparent to the incident radiation, microlenses may be formed above pixels 19 and 60, if desired. The obtained radiation detection device advantageously enables to take advantage, in real time, of the introduction of a high-sensitivity infrared detection in the forming of an image. The method for forming the device according to the invention is simple and compatible with CMOS technology.

Thereby, the radiation detector according to the invention benefits from the advantages of CMOS technology to form a conventional color image and to multiplex the current of electrons photogenerated by the infrared photodiode and the detection circuits. The use of interference filters enables to both decompose the visible component of the incident radiation into elementary colors and to filter the infrared component. This type of filter advantageously contributes to simplifying the forming of the radiation detector.

Although the forming of a few pixels including an infrared pixel has been described, the techniques described herein apply to the forming of an array sensor comprising millions of infrared and visible pixels (color or black and white).

The invention claimed is:

1. A radiation detection device comprising:
   a silicon layer provided with a front surface and with a back surface;
   first and second readout circuits formed on the front surface of the silicon layer;
   a photodiode formed on the front surface of the silicon layer and connected to the first readout circuit;
   an electrically-insulating layer covering the front surface of the silicon layer to cover the first and second readout circuits and the photodiode; and
   an infrared photodiode made of a material optimized for infrared detection and arranged on the electrically-insulating layer so as to be laterally offset with respect to the photodiode, the offset being along an axis parallel to the front surface and to the back surface;
   an interconnect crossing the electrically-insulating layer and emerging at the surface of the electrically-insulating layer, the interconnect connecting the second readout circuit to the infrared photodiode; and
   an infrared radiation filtering structure totally covering the photodiode at the front surface of the silicon layer, without covering the infrared photodiode.

2. The radiation detection device according to claim 1, wherein the infrared photodiode and the infrared radiation filtering structure are arranged in a same plane parallel to the front surface and the back surface of the silicon layer.

3. The radiation detection device according to claim 1, wherein the infrared radiation filtering structure has a spectral transmission characteristic corresponding to one of the three decomposition paths necessary to reproduce the colors.

4. The radiation detection device according to claim 3, wherein three infrared radiation filtering structures corresponding to the three decomposition paths necessary to reproduce the colors each cover an associated photosensitive area comprised in the silicon layer.

5. The radiation detection device according to claim 1, wherein the material optimized for infrared detection is a material having a bandgap smaller than 0.8 eV.

6. The radiation detection device according to claim 1, wherein the infrared radiation filtering structure is formed from a stack comprising an alternation of metal layers and of dielectric layers.

7. A method of forming a radiation detection device comprising the steps of:
   providing a silicon layer provided with a front surface and with a back surface;
   providing an electrically-insulating layer covering the front surface of the silicon layer, first and second readout circuits, and a photodiode formed on the front surface of the silicon layer;
   providing a stack of infrared photodiode layers, made of a material optimized for infrared detection;
   assembling the stack of layers on the electrically-insulating layer;
   etching the stack of layers above the photodiode while leaving an island of the stack configured to form an infrared photodiode;
   forming an infrared radiation interference filtering structure to cover the photodiode and to cover the infrared photodiode; and
   removing the infrared radiation filtering structure above the infrared photodiode,
   wherein the infrared photodiode and the infrared radiation filtering structure are arranged in a same plane parallel to the front surface and the back surface of the silicon layer.

8. The method of forming a radiation detection device according to claim 7, wherein a metal contact is formed at the surface of the electrically-insulating layer so that, during the assembly step, the metal contact connects the infrared photodiode to the second readout circuit formed in said silicon layer.

9. The radiation detection device comprising:
   a silicon layer provided with a front surface and with a back surface;
   first and second readout circuits formed on the front surface of the silicon layer;
   a photodiode formed on the front surface of the silicon layer and connected to the first readout circuit;
   an electrically-insulating layer covering the front surface of the silicon layer to cover the first and second readout circuits and the photodiode; and
   an infrared photodiode made of a material optimized for infrared detection and arranged on the electrically-insulating layer so as to be laterally offset with respect to the photodiode, the offset being along an axis parallel to the front surface and to the back surface;
   an interconnect crossing the electrically-insulating layer and emerging at the surface of the electrically-insulating layer, the interconnect connecting the second readout circuit to the infrared photodiode; and
   an infrared radiation filtering structure covers the photodiode without covering the infrared photodiode,
   wherein the infrared photodiode and the photodiode are not face-to-face, and are arranged to detect an incident radiation to the front surface of the silicon layer, and
   wherein the infrared photodiode and the infrared radiation filtering structure are arranged in a same plane parallel to the front surface and the back surface of the silicon layer.

* * * * *